US008819288B2

(12) United States Patent
Abdo et al.

(10) Patent No.: US 8,819,288 B2
(45) Date of Patent: Aug. 26, 2014

(54) OPTIMIZED DATA STREAM COMPRESSION USING DATA-DEPENDENT CHUNKING

(75) Inventors: Nadim Y. Abdo, Bellevue, WA (US); Nikolaj S. Bjorner, Woodinville, WA (US)

(73) Assignee: Microsoft Corporation, Redmond, WA (US)

( * ) Notice: Subject to any disclaimer, the term of this patent is extended or adjusted under 35 U.S.C. 154(b) by 1078 days.

(21) Appl. No.: 11/855,986

(22) Filed: Sep. 14, 2007

(65) Prior Publication Data

US 2009/0077252 A1    Mar. 19, 2009

(51) Int. Cl.
*G06F 15/173* (2006.01)
*G06F 15/16* (2006.01)

(52) U.S. Cl.
USPC .......................................... 709/247; 709/231

(58) Field of Classification Search
USPC ..................... 341/95; 709/231, 247
See application file for complete search history.

(56) References Cited

U.S. PATENT DOCUMENTS

| 5,016,009 A | * | 5/1991 | Whiting et al. ................ 341/67 |
| 5,049,881 A | * | 9/1991 | Gibson et al. ................ 341/95 |
| 5,371,499 A | * | 12/1994 | Graybill et al. ............... 341/51 |
| 5,406,278 A | * | 4/1995 | Graybill et al. ............... 341/51 |
| 5,951,623 A | * | 9/1999 | Reynar et al. ................ 708/203 |
| 6,091,777 A | | 7/2000 | Guetz et al. |
| 6,320,523 B1 | | 11/2001 | York et al. |
| 6,927,706 B2 | | 8/2005 | Horie |
| 7,064,688 B2 | | 6/2006 | Collins et al. |
| 7,127,525 B2 | | 10/2006 | Coleman et al. |
| 7,171,444 B2 | | 1/2007 | Deshpande |
| 2002/0140583 A1 | * | 10/2002 | Parenteau et al. ............. 341/51 |
| 2003/0093568 A1 | * | 5/2003 | Deshpande ................ 709/247 |
| 2003/0126294 A1 | | 7/2003 | Thorsteinson et al. |
| 2005/0044294 A1 | | 2/2005 | Vo et al. |
| 2005/0104753 A1 | * | 5/2005 | Dror et al. ..................... 341/51 |
| 2005/0210151 A1 | | 9/2005 | Abdo et al. |
| 2005/0281470 A1 | | 12/2005 | Adams |

(Continued)

FOREIGN PATENT DOCUMENTS

| JP | 2003108464 | 4/2003 |
| JP | 2005269618 | 9/2005 |

(Continued)

OTHER PUBLICATIONS

Randal C. Burns, Differential Compression: A Generalized Solution for Binary Files, Master thesis, University of California Santa Cruz, U.S., Apr. 4, 2013, Dec. 1996, p. 26 http://citeseerx.ist.psu.edu/viewdoc/similar?doi=10.1.1.35.7480&type=ab.*

(Continued)

*Primary Examiner* — Rupal Dharia
*Assistant Examiner* — Robert B McAdams
(74) *Attorney, Agent, or Firm* — Jim Sfekas; Kate Drakos; Micky Minhas

(57) ABSTRACT

Systems and methods for compression of data to be transmitted are described. A data stream, such as a byte code sequence, is partitioned into one or more data chunks. The data chunks can be associated with an identifier, such as a signature that differentiates one data chunk from the other. Thus, different data chunks would be identifiable through different signatures. The data chunks associated with the signatures can be compared with a repository or a history buffer. The history buffer includes a collection of previously transmitted data chunks each associated with their respective signature.

19 Claims, 6 Drawing Sheets

(56) References Cited

U.S. PATENT DOCUMENTS

| 2006/0112264 | A1 | 5/2006 | Agarwal | |
|---|---|---|---|---|
| 2007/0043875 | A1 | 2/2007 | Brannon, Jr. | |
| 2008/0005236 | A1* | 1/2008 | Schmieder | 709/204 |
| 2009/0060047 | A1* | 3/2009 | Schneider | 375/240.23 |

FOREIGN PATENT DOCUMENTS

| JP | 2005302004 | 10/2005 |
|---|---|---|
| KR | 20010041681 | 5/2001 |
| KR | 20060043620(A) | 3/2005 |
| KR | 20060051041(A) | 9/2005 |
| WO | WO9625801(A1) | 8/1996 |
| WO | WO0208956(A1) | 1/2002 |

OTHER PUBLICATIONS

Doherty, "Thin-Client Devices", at <<http://www.networkcomputing.com/1210/1210buyers3.html>>, May 14, 2001, pp. 4.

"Remote Desktop Protocol (RDP) Features and Performance", at <<http://www.microsoft.com/technet/prodtechnol/Win2KTS/evaluate/featfunc/rdpfperf.mspx>>, Microsoft Corporation, 2007, pp. 4.

Wong, et al., "Evaluating Windows NT Terminal Server Performance", at <<http://delivery.acm.org/10.1145/1270000/1268442/p15-wong.pdf?key1=1268442&key2=8904918811&coll=Portal&dl=GUIDE&CFID=27916501&CFTOKEN=50908081>>, The USENIX Association, 1999, pp. 11.

Burns, "Differential Compression: A Generalized Solution for Binary Files—Thesis", retrieved on Aug. 27, 2010 at <<http://www.almaden.ibm.com/cs/storagesystems/delta/rbmsthesis.pdf>>, Dec. 1996, 70 pages.

Muthitacharoen, "A Low-Bandwidth Network File System", Proceedings of the ACM Symposium on Operating Systems Principles, ACM, US, Oct. 21, 2002, pp. 174-187.

Translated Japanese Office Action mailed Aug. 3, 2012 for Japanese Patent Application No. 2010-525041, a counterpart foreign application of U.S. Appl. No. 11/855,986, 8 pages.

The Chinese Office Action mailed Apr. 28, 2012 for Chinese patent application No. 200880107012.7, a counterpart foreign application of U.S. Appl. No. 11/855,986, 9 pages.

The European Office Action mailed Apr. 16, 2012 for European Patent Application No. 08799521.3, a counterpart foreign application of U.S. Appl. No. 11/855,986, 10 pages.

Translated Japanese Office Action mailed Apr. 19, 2103 for Japanese patent application No. 2010-525041, a counterpart foreign application of U.S. Appl. No. 11/855,986, 8 pages.

The Chinese Office Action mailed Dec. 5, 2012 for Chinese patent application No. 200880107012.7, a counterpart foreign application of U.S. Appl. No. 11/855,986, 7 pages.

The European Office Action mailed Dec. 21, 2012 for European patent application No. 08799521.3, a counterpart foreign application of U.S. Appl. No. 11/855,986, 9 pages.

Papastavrou, et al., "A decade of dynamic web content: a structured survey on past and present practices and future trends", IEEE Communciations Surveys, IEEE, New York, NY, US, vol. 8, No. 2, Apr. 1, 2006, pp. 52-60.

Jain, et al., "TAPER: Tiered Approach for Eliminating in Replica Synchronization", USENIX Association, FAST 2005, 4th USENIX Conference on File and Storage Technologies, Dec. 2005, pp. 281-294.

Translated Japanese Office Action mailed Oct. 1, 2013 for Japanese patent application No. 2010-525041, a counterpart foreign application of U.S. Appl. No. 11/855,986, 6 pages.

* cited by examiner

OPTIMIZED DATA STREAM COMPRESSION USING DATA-DEPENDENT CHUNKING

BACKGROUND

Typically, interconnected computing-based systems transmit large amounts of data amongst themselves. Computing devices may communicate (transmit and receive) data as a whole, or the data can be segmented into manageable portions that allow efficient and feasible transfer. To provide the data from one computing device, such as a server to another device (e.g., a client device), the data can be transmitted as a stream. Streaming of data provides increased functionality, allowing a user quicker reception of the data. Without streaming the client device could experience a delay before the entire data can be rendered at the client end.

A device (e.g., a server), can transmit data in compressed form. Compression results in efficient streaming of the data between one or more devices over the network. For example, a network, including a server device and one or more client devices, may have limited bandwidth. The bandwidth may limit the amount of data communicated from the server to a client device in a certain amount of time. By compressing the streaming data, more data can be transferred over low-bandwidth networks at any one time and therefore improve the utility of the streamed data.

Protocols, such as Remote Desktop Protocol (RDP) developed by the Microsoft® Corporation, may use a variety of techniques for implementing data compression. The techniques can either be lossy or lossless depending on the requirement. These techniques reduce the bandwidth usage by the streaming data.

SUMMARY

This summary is provided to introduce concepts for implementing streaming real-time compression. These concepts are further described below in the detailed description. The presented summary is not intended to identify essential features of the claimed subject matter, nor is it intended for use in determining the scope of the claimed subject matter.

In an embodiment, a compression is performed on a byte code sequence of a data stream, by partitioning the byte code sequence into data chunks. A unique signature is associated with the data chunks. Signatures of the data chunks are compared to previously stored signatures. Scanning may be further performed on matched data chunks to determine match-lengths, which may extend longer than a chunk size.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

Figure 1:
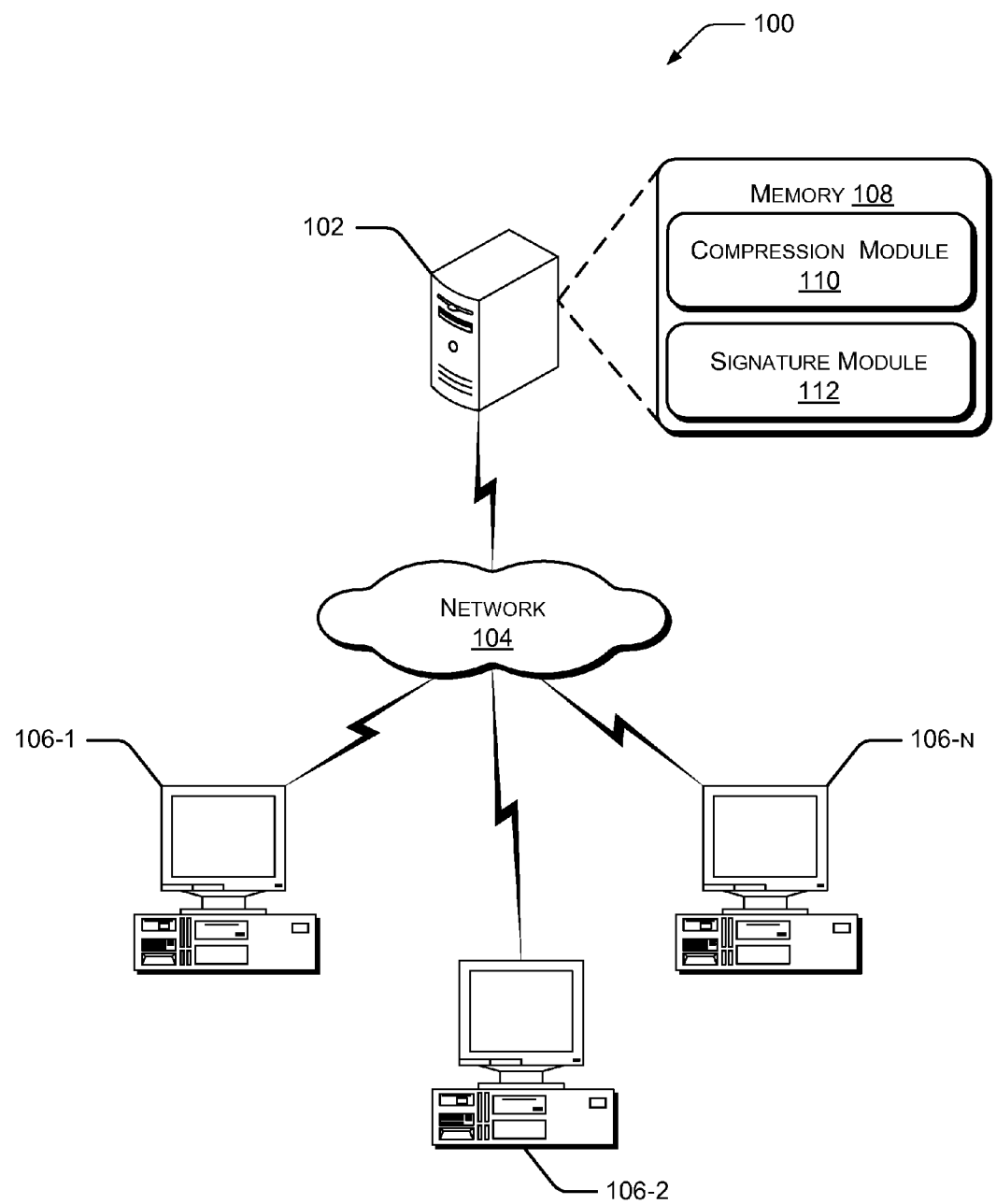
FIG. 1 illustrates a block diagram of an exemplary architecture for implementing real-time compression.

Systems and methods for implementing streaming real-time compression are described. As indicated previously, communication of data between one or more computing-based devices can be implemented by streaming the data via a connecting medium between the communicating devices. For example, a client may request a server device for accessing data. The data can be transmitted over a network, to the user in the form of streamed data. The streamed data may be compressed, before the data is transmitted.

As an example, in cases implementing a protocol such as Remote Desktop Protocol (RDP), the size of the data to be transmitted over a network can be minimized using bulk compression techniques. The data can be transmitted as packets. The compressed data packets may be transmitted to the intended destination. At the destination, the compressed data packet can be decompressed for restoring the data within the compressed packet. In cases where the data compression is not performed, the data is transmitted to the destination in uncompressed form, and data compression can be performed for subsequent data packets.

To this end, systems may include one or more modules for compression of data packets to be transmitted. The modules can partition an input data stream, for example a byte code sequence, into one or more data "chunks". In an implementation, the size of the data chunks is tunable. In particular, average size of a chunk is tunable but the chunk lengths are not fixed, the average size is determined by a chunking algorithm which decides where in the data-stream to place a chunk start or end based on the properties of the data in the stream itself. The data chunks can be associated with an identifier, such as a signature that differentiates one data chunk from the other. Thus, different data chunks would be identifiable through different signatures. The data chunks associated with the signatures, interchangeably referred to as "signatured data chunks", can be compared with a repository or a history buffer. The history buffer includes a collection of previously transmitted data chunks each associated with their respective signature. Based on the comparison, the input data can be changed to include a reference that corresponds to similar data chunks, and not the byte codes of the data chunks themselves. Therefore, portions of the input data stream can be transmitted as a stream having one or more references based on comparison with data chunks obtained from the history buffer, along with a series of byte code for which no corresponding match was located within the history buffer. A larger size of the history buffer could consequently result in a better search.

In addition, the history buffer and their respective memory overhead are tunable. Previous techniques were restrictive due to the limited size of the history buffer and its memory overhead; and slow search speeds because of the need to do inspections on a per-byte basis. For example, each byte of occupancy in the history buffer would require an additional four bytes of memory overhead. In the current instant case, the size of the history buffer and the memory overhead is tunable, for example, for a history buffer of 600 KB size can have a memory overhead of 2 MB.

In an implementation, the compression technique as described can further be appended with another secondary compression module. The secondary compression module is instrumented to gather closer matches between the signature of their respective data chunks and the data chunks that are stored in the history buffer. Such a signature based chunking compression can be used as a pre-processor for a higher quality Lempel-Ziv or similar compression algorithm, even if the higher-quality compression algorithms (i.e., secondary compression pass or module) are able to handle the entire data. This may be applied in real-time sensitive applications, such as RDP. It is to be appreciated that Lempel-Ziv is just an exemplary method. Other algorithms may be employed such as Burrows-Wheeler's, where such algorithms are high quality algorithm that obtain maximal compression based on their encoding scheme, as opposed to the described chunk-based method that does not. While aspects of describes systems and methods relating to implementing diverse topic phrase extraction can be implemented in any number of different computing systems, environments, and/or configurations, embodiments of system analysis and management are described in the context of the following system architecture(s).

An Exemplary Architecture for Real-time Compression

FIG. 1 illustrates an exemplary computer system 100 implementing streaming real-time compression. The computer system 100 includes a server computing device 102, network 104 and one or more computing-based or client devices 106(1)-(N). The server-computing device 102 and client devices 106(1)-(N) can include personal computers (PCs), web servers, email servers, home entertainment devices, game consoles, set top boxes, and any other computing-based device known in the art. The client devices 106(1)-(N) may be collectively referred to as client devices 106.

Moreover, the computer system 100 can include any number of client devices 106. For example, the computer system 100 can be a company network, including thousands of office PCs, various servers, and other computing-based devices spread throughout several countries. Alternately, in another possible implementation, the system 100 can include a home network with a limited number of PCs belonging to a single family. The client devices 106 can be coupled to each other in various combinations through a wired and/or wireless network, including a LAN, WAN, or any other networking technology known in the art.

The server-computing device 102 can provide terminal services for remote applications. The server-computing device 102 can host one or more applications executable on it. On execution, the server-computing device 102 can transmit the relevant output over the network 104 to one or more of the client devices 106. Examples of computer 100 include but are not limited to systems based on RDP. The server-computing device 102 can be referred to as the server 102.

The server-computing device 102 includes memory 108. The memory 108 further includes a compression module 110 and a signature module 112. The compression module 110 compresses the data to be transmitted from the server-computing device 102 to any one of the client devices 106. The generated data is a result of execution of one or more applications that are present on the server-computing device 102. The applications on the server-computing device 102 can be executed upon interaction with or commands from any one or more of the client devices 106.

The compression module 110 can implement compression by partitioning the data to be transmitted into one or more data chunks. Typically, data can be represented as a series of bytes. Each of the data chunks therefore corresponds to one or more portions of a byte code sequence. In an implementation, the compression module 108 performs partitioning based on data included within the input data stream.

For purposes of discussion, local content dependent chunking may refer to methods that partition data streams into chunks based on local information only. In other words, the position of chunk boundaries in a given data stream may depend only on the values of a fixed number of bytes to the left and right of a boundary position.

The significance of local (i.e., data dependent) chunking methods is that there is assurance that data streams that differ only on the content of the first byte will have equal chunks, except for the first chunk. This can translate to chunking that is resilient against misalignment in positions in data streams.

The significance of using chunks and their signatures is that relatively few lookups (i.e., hash-table) are made per byte. Since a chunk is made of several bytes, one lookup is made per chunk, and there will in average be less than one hash table lookup per byte. Alternatively, a chunk size may be fixed (e.g., 16) and signatures computer for a sliding window (e.g., of 16 bytes), and has table lookup is made for every byte. This allows the ability to find every pair of matching 16 byte chunks, but may require one table lookup per byte, and is amenable to a higher computational overhead. Compression based on data-dependent chunking does not have such computational overhead.

The following is an example for implementation for data-dependent chunking. A horizon h=16 and a window size w=16 are fixed. Every sequence of w (16) bytes, is treated as a 128-bit number (16*8=128). Let B be a buffer/stream of bytes. B[I:J] denotes the subsequence of bytes from B that start in I and end in J. Position B[I+h−1] is a chunk boundary if the sequence B[I+h−w:I+h−1], when interpreted as a number is larger than all the 2 h numbers to the left and right: B[I−w:I−1]. . . , B[I+2 h−w: I+2 h−1]. Efficient algorithms may be implemented for determining chunk boundaries based on the definitions.

Upon partitioning the data into data chunks, the signature module 112 associates the data chunks with an index, such as a signature. The signature module 112 associates the signature to the variable sized data chunks based on the attributes of the data stream. Therefore, data chunks with different signatures are differentiated from one another. Similar signatures can be indicative of data chunks including similar byte data within them. The signatured data chunks can be stored in an external repository as a data structure. The data structure can include pointers to one or more data chunks stored in the history buffer. The data stream to be transmitted can be represented as a series of byte codes intermittent with one or more indexes, where the indexes associated with a corresponding byte code.

Figure 2:
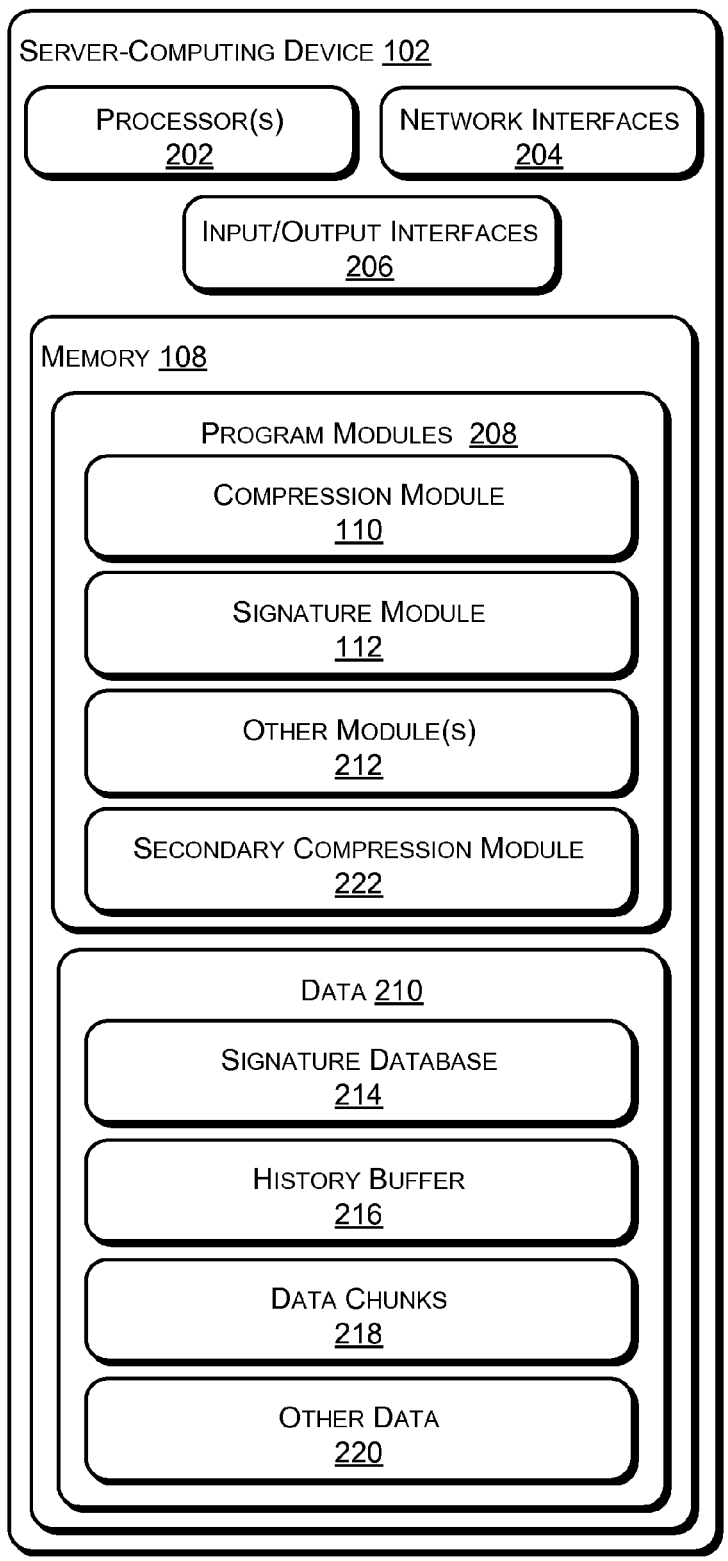
FIG. 2 illustrates a block diagram of an exemplary computing system that implements real-time compression.

Various aspects of the partitioning of the data bytes into one or more data chunks and compression of the data stream are described further in detail in reference with FIG. 2.

An Exemplary Server Device

FIG. 2 illustrates relevant exemplary components of the server-computing device 102. The server-computing device 102, referred to as server 102, can include one or more processor(s) 202, network interfaces 204, I/O interfaces 206 and a memory 108. The processor(s) 202 may include microprocessors, microcomputers, microcontrollers, digital signal processors, central processing units, state machines, logic circuitries, and/or any devices that manipulate signals based on operational instructions. Among other capabilities, the processor(s) 202 are configured to fetch and execute computer-readable instructions stored in the memory 108.

The network interfaces 204 enable the server 102 to communicate to other computing-based devices (e.g., client devices 106), over the network 104. The network interfaces 204 may include one or more ports for connecting a number of computing devices to the each other or to a server-computing device. The network interfaces 204 can facilitate communications within a wide variety of networks and protocol types, including wired networks (e.g., LAN, cable, etc.) and wireless networks (e.g., WLAN, cellular, satellite, etc.).

I/O interfaces 206 provide input-output capabilities for the server 102. The I/O interfaces 206 can include one or more ports for connecting a number of input devices such as keyboard, mouse and so on and a number of output devices such as monitor, speakers, and so on. In one implementation, the server 102 receives input data from a user such as application component description via the keyboard or mouse connected through I/O interfaces 206.

The memory 108 can include any computer-readable medium known in the art including, for example, volatile memory (e.g., RAM) and/or non-volatile memory (e.g., flash). As illustrated in FIG. 2, the memory 108 also can include program(s) 208 and data 210. The program(s) 208 include, for example, the compression module 110, the signature module 112, secondary compression module 222 and other application(s) 212. The other application(s) 212 include programs that supplement applications on a computing-based device, such as application updating. The data 210 include, for example, signature database 214, history buffer 216, data chunks 218, and other data 220.

The compression module 110 implements compression of an input data stream for transmission of information from server 102 to any one or more of the client devices 106. The transmission of data can be for implementing applications based on RDP. Although some of the examples described herein are based on applications implementing RDP, such techniques may also be applicable to other environment. To this end, the compression module 110 partitions the data stream into one or more data chunks. The data chunks can be of a variable byte length or can be of a fixed byte length.

For example, the server 102 receives the following byte code sequence as part of the input data stream, for transmitting from one source to a specified destination:
4 5 9 7 4 5 6 3 9 4 5 1 4 6
The above indicated byte code, can be of variable length. In an implementation, the data stream to be transmitted can be stored in the history buffer 216. The data is added to the history buffer 216. Once added, the data can be sent to the compression module 110. The compression module 110 partitions the data stream into one or more data chunks 218. Returning to the example as presented above, the byte code sequence can be partitioned into two portions, 4 5 9 7 4 5 6 which is referred to as chunk A; and 3 9 4 5 1 4 6 which is referred to as chunk B. Chunks A and B can be stored in data chunks 218, and are illustrated in this example, to have an equal number of byte codes. The input data stream can be partitioned into any number of data chunks that can include a variable number of byte codes without deviating from the scope of the claimed subject matter. The byte codes in various data chunks 218 correspond to byte codes included within the input data stream. In an implementation, the average length of the byte codes in the data chunks 218 can be sixteen bytes.

The manner in which the partitioning of the data stream is performed can be implemented using any techniques known in the art. In an implementation, the partitioning performed by the compression module 110 partitions the data stream based on previously occurring byte code patterns present within previously occurring byte code sequences. Generally, compression is based on the observation there is a lot of redundancy. Partitioning is not really tied to redundancy, but rather to algorithms that will be "stable" in choosing the same cut points based on similar data patterns. Transmitting redundant data may result in overhead thereby affecting system performance. While partitioning, the point where the partition is done on the data stream, referred to as a cut-point, can be based on content of the data stream itself. In another implementation, the compression module 110 produces similar data chunks for similar byte codes, even if the similar byte codes are surrounded by different byte code patterns. In an implementation, the compression module 110 partitions the data stream based on one of various known chunker functions. Compression as described in this example, proceeds on a per data chunk basis as opposed to the per byte code basis as known previously.

The data chunks 218, namely chunks A and B, obtained from the partitioning of the byte code sequence by the compression module 110, are associated with a signature. In an implementation, the signature module 112 associates the data chunks 218 with a signature. The signature module 112 evaluates the signature based on the byte codes included within the data chunks 218. In an implementation, the signature module 112 evaluates the signature by using a hashing algorithm on the data chunks 218. The signatured data chunks can be stored in signature database 214. In an implementation, the signature database 214 is an in-memory hash table that retains the signatured data chunks along with the offsets of the data chunks 218. The signatured data chunks, stored in signature database 214, can also correspond to data chunks that have been previously compressed and transmitted by the server 102.

The signatured chunks A and B are compared with stored signatured data chunks. As discussed above, the stored signature data chunks correspond to data that may have been previously transmitted. The signature module 112 can be instrumented to compare the signatures of the chunks A and B with the signatures of the stored data chunks corresponding to previous transmissions. The signatures associated with the previously transmitted data chunks can also be evaluated through known techniques, such as a module using a hashing algorithm.

The comparison performed by the signature module 112 determines the extent of similarity between the chunks A and B and the data chunks of previous transmissions. For example, one or more data chunks can be considered to be matching with the previous data chunks, if their respective signatures are similar. Data chunks that are not exactly the same, but are similar, can be considered as similar data chunks, may be indicative of greater similarity between one or more byte codes of the input data stream, and not just similar byte codes in one or more data chunks.

The signature module 112 lists the data chunks 218 that have signatures similar to the signatures of the chunks corresponding to the byte codes of an input data stream, such as chunks A and B. If the signature module 112 does not find any data chunks 218 that have similar signatures to the data chunk in consideration (e.g., chunk A or B), then its corresponding byte code is sent in an unchanged manner, i.e. as a literal to the output buffer. In an implementation, the listed data chunks can be stored in data chunks 218.

For each of the data chunks 218 that have a signature similar to the chunks A or B, the matching candidates are scanned to ascertain the extent of similarity between one of the chunks A or B, and the data chunks 218 that are found to have a similar signature associated with them. For example, the compression module 110 can scan the matching candidates to ascertain the extent of similarity between the data chunks 218. It is to be noted that the similarity in signatures occur due to a similarity in the byte code pattern. By way of example, the signature of data chunk A could be similar to another data chunk when some portions of their byte code sequence are same. Therefore, while scanning, the compression module 110 performs a forward and backward scan of the byte code sequence of the matching candidate to determine if a larger pattern exists within the data chunk, such as one of the data chunks 218. The resulting portion of the data chunks is a larger byte code sequence, referred to as the match-length, which is matching to the byte code sequence within the data chunks 218 corresponding to the input stream. The match-length can be stored in other data 220.

In the manner described above, a collection of different match-lengths is obtained by performing the above techniques for a plurality of chunks. In an implementation, the number of chunk searches for obtaining a match-length collection can be limited by a threshold value. For example, the compression module 110 can scan the set of matching candidates to obtain a match-length collection having a number of match-lengths equal to the threshold value. It is to be noted that in RDP based applications, data streams are such that there exists a very high likelihood that matching data chunks form a part of a much larger match segment. Therefore, an examination of only the matching chunks would enable finding byte sequences that comprise larger matches than the chunks themselves.

The match-lengths within the match-length collection are optimized to select the best combination of matches. A need for optimization may arise, because some of the match-lengths may have portions that overlap with other match-lengths. In an implementation, the match-length collection can be optimized using a "greedy" algorithm known in the art. For example, match-lengths that are completely included within another match-length are excluded. Other mechanisms known in the art can also be used for optimizing the match-length collection.

Once the best match-lengths are obtained, the compression module 110 generates the output as a list including match-length, copy-offset tuples, and byte code sequences. The byte code sequences are ones for which no matching candidate were found having similar signatures. The match-length also includes attributes that are indicative of the position and the number of bytes that are replaced in the input data stream. In one implementation, the output by the compression module 110 is generated without any-bit packing to maintain byte code alignment for subsequent byte code sequences. The output generated by the compression module 110 is passed to a secondary compression module 222. The secondary compression module 222 can be used for determining closer and shorter length matches, which may have been overlooked by the compression module 110. Examples of secondary compression module include, but are not limited to compressor developed by Microsoft® Corporation such as MPPC compressor, RDP bulk compressor, and the like.

Exemplary Methods

Exemplary methods for implementing streaming real-time compression are described with reference to FIGS. 1 and 2. These exemplary methods may be described in the general context of computer executable instructions. Generally, computer executable instructions can include routines, programs, objects, components, data structures, procedures, modules, functions, etc., that perform particular functions or implement particular abstract data types. The methods may also be practiced in a distributed computing environment where functions are performed by remote processing devices that are linked through a communications network. In a distributed computing environment, computer executable instructions may be located in both local and remote computer storage media, including memory storage devices.

Figure 3A:
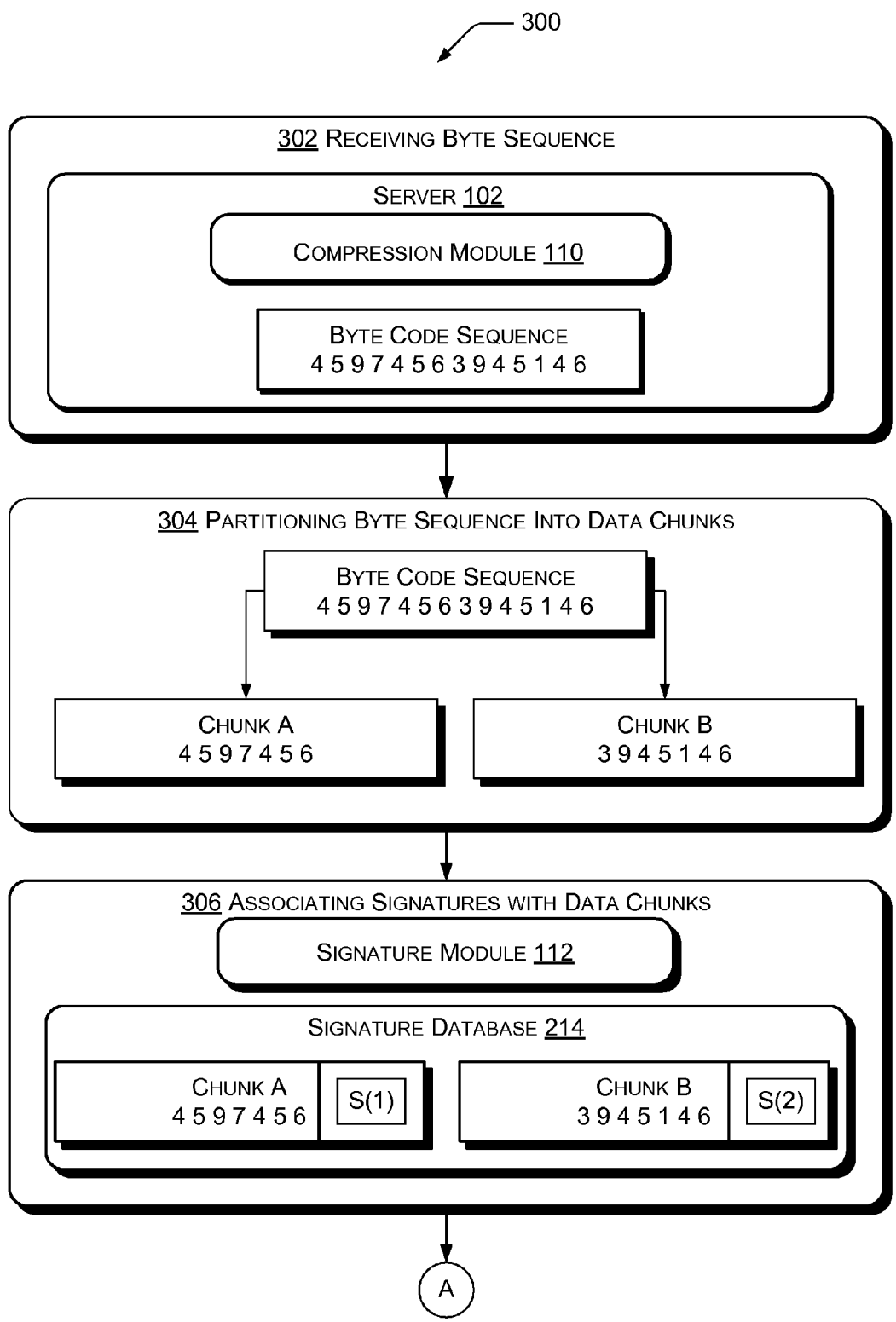
FIGS. 3(A), 3(B), and 3(C) illustrate a flowchart of exemplary methods for implementing streaming real-time compression.
Figure 3B:
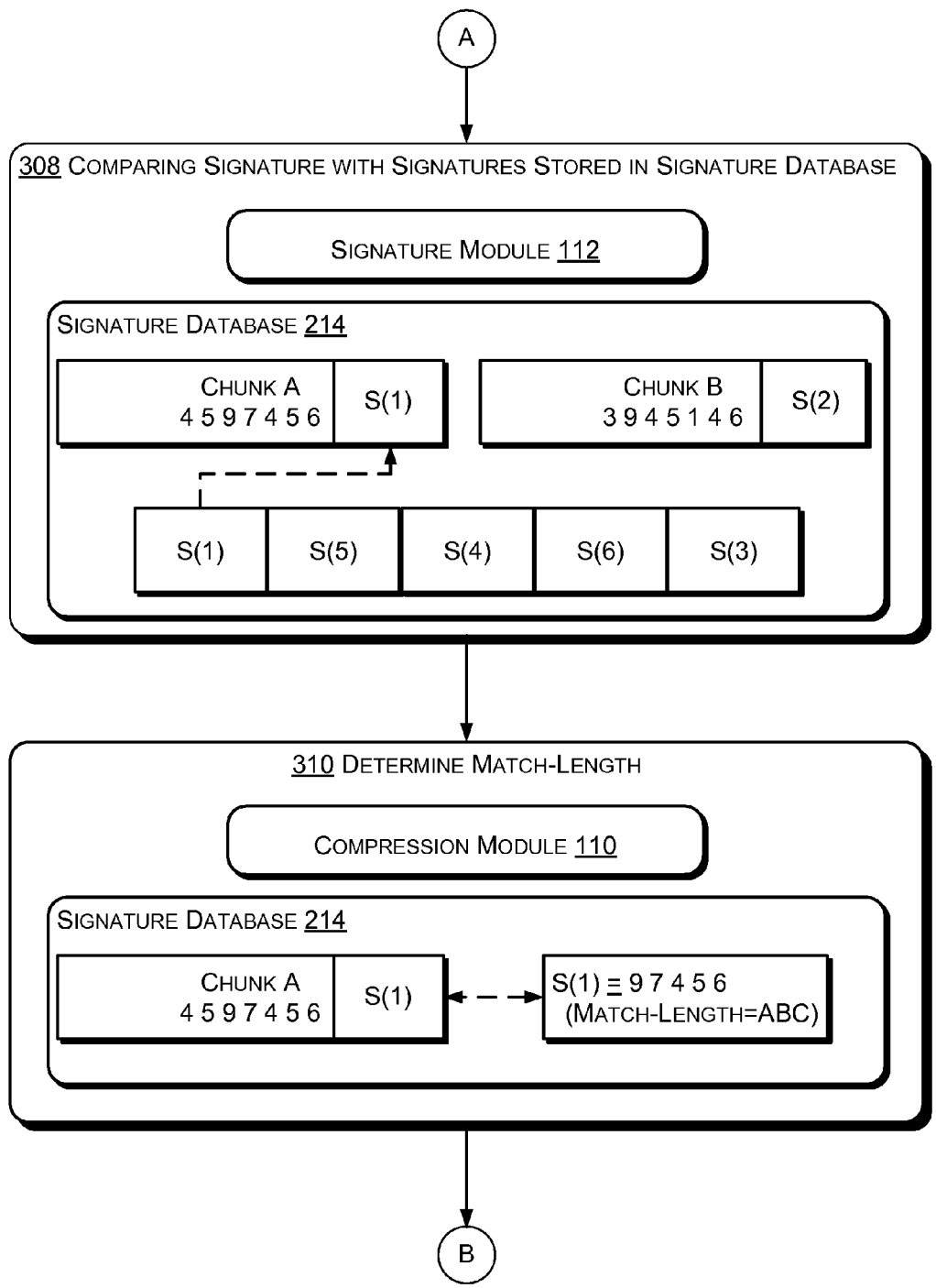
Figure 3C:
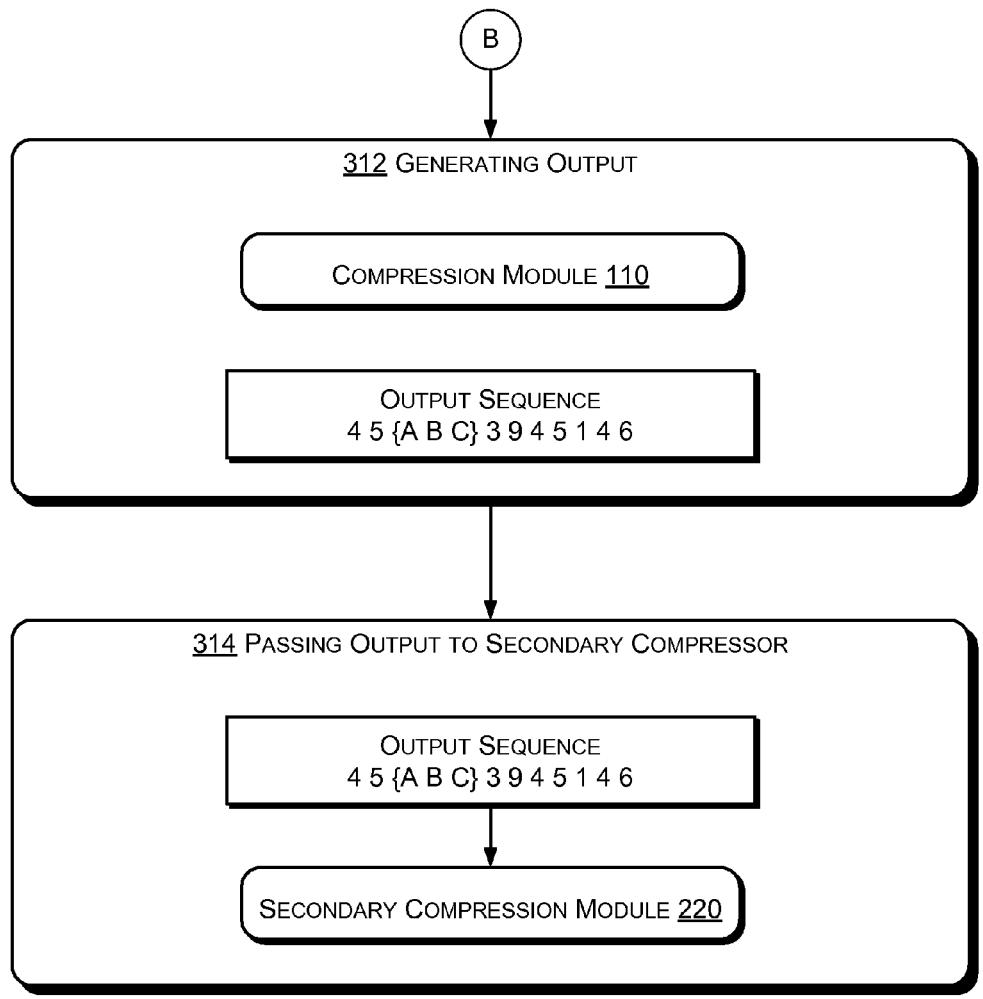

FIGS. 3(A), 3(B), and 3(C) illustrate an exemplary flow diagram 300 depicting streaming real-time compression being implemented by one or more program modules or agents residing on a computing device, for example, any one or more of the client devices 106.

The order in which the methods are described, is not intended to be construed as a limitation, and any number of the described method blocks can be combined in any order to implement the methods, or an alternate methods. Additionally, individual blocks may be deleted from the methods without departing from the spirit and scope of the subject matter described herein. Furthermore, the methods can be implemented in any suitable hardware, software, firmware, or combination thereof.

At block 302, an input data stream can be received as a byte code sequence. For example, the compression module 110 can receive the byte code sequence as a part of an input data stream meant for transmitting from a source such as the server 102, to a destination, such as one or more of the client devices 106. Typically, streaming data can be transmitted as a series of data packets. Each of the data packets includes data in the form of a byte code sequence. In an implementation, the byte code sequence is added to the history buffer 216. The byte code sequence can also be accommodated within the history buffer 216 using a sliding window mechanism.

At block 304, the byte code sequence can be partitioned into one or more data chunks. For example, the compression module 110 can partition the byte code sequence into two data chunks, such as chunk A and chunk B. The byte codes in various data chunks 218 correspond to byte codes included within the input data stream. In an implementation, the average length of the byte codes in the data chunks 218 can be sixteen bytes. The manner in which the partitioning of the data stream is performed can be implemented using any techniques that are known in the art. In an implementation, the partitioning performed by the compression module 110 partitions the data stream based on previously occurring byte code patterns present within previously occurring data streams. The data chunks (chunks A and B), can be stored as data chunks 218.

At block 306, a signature can be associated with the data chunks. For example, the signature module 112 can associate a signature with the data chunks A and B. The signature module 112 evaluates the signature based on the byte codes included within the data chunks 218. The signature module 112 evaluates the signature by using a hashing algorithm on the data chunks 218. The signatured data chunks can be stored in signature database 214.

At block 308, the signatures of the data chunks corresponding to the input data stream are compared with the stored signatures of data chunks that may have been communicated previously. In an implementation, the signature module 112 compares the signatures of the chunks A and B with the signatures of the stored data chunks from previous transmissions. The comparison determines the extent of similarity between the chunks A and B and the data chunks of previous transmissions. Chunks with a high likelihood of matching can be determined. Data chunks that are not exactly same but similar can be considered, as similar data chunks may be indicative of greater similarity between one or more byte codes of the input data stream, and not just similar byte codes in one or more data chunks. In case the signature module 112 does not find any data chunks 218 that have similar signatures to the data chunk in consideration, such as chunk A or B, then its corresponding byte code is emitted in an unchanged manner, i.e. as a literal to the output buffer.

At block 310, a sequence of byte codes, referred to as the match-length, is determined. It is to be noted that a match between the signatures of the data chunks of the input data stream and the data chunks of the previously transmitted data is indicative of larger byte code segments that may have code similar to the code sequence in the input data stream. In an implementation, the compression module 110 performs a forward and backward scan of the byte code sequence of the matching candidate to determine if a larger pattern exists within the data chunk, such as one of the data chunks 218. The resulting portion of the data chunks is a larger byte code sequence, referred to as the match-length, which is matching to the byte code sequence within the data chunks 218 corresponding to the input stream. The match-length can be stored in other data 220.

In addition, the match-lengths within the match-length collection are optimized to select the best combination of matches and to avoid portions of the match-lengths that overlap with other match-lengths. In an implementation, the match-length collection can be optimized using a greedy algorithm known in the art.

At block 312, the output of the compression module is generated. For example, the compression module 110 generates an output, which includes a list including match-length, copy-offset tuples, and byte code sequences. The match-length also includes attributes that are indicative of the position and the number of bytes that are replaced in the input data stream. The byte code sequence in the output corresponds to data chunks 218 for which no matches could be determined from the signature database 214.

At block 314, the generated output is passed to a secondary compression module for further compression. For example, the compression module 110 passes the generated output to a secondary compression module 222. The secondary compression module 222 is used for determining closer and shorter length matches, which may have been overlooked by the compression module 110 during the process of partitioning and signature assigning. Examples of secondary compression module include, but are not limited to compressor developed by the Microsoft® Corporation, such as MPPC compressor, RDP bulk compressor, and the like.

An Exemplary Computing Environment

Figure 4:
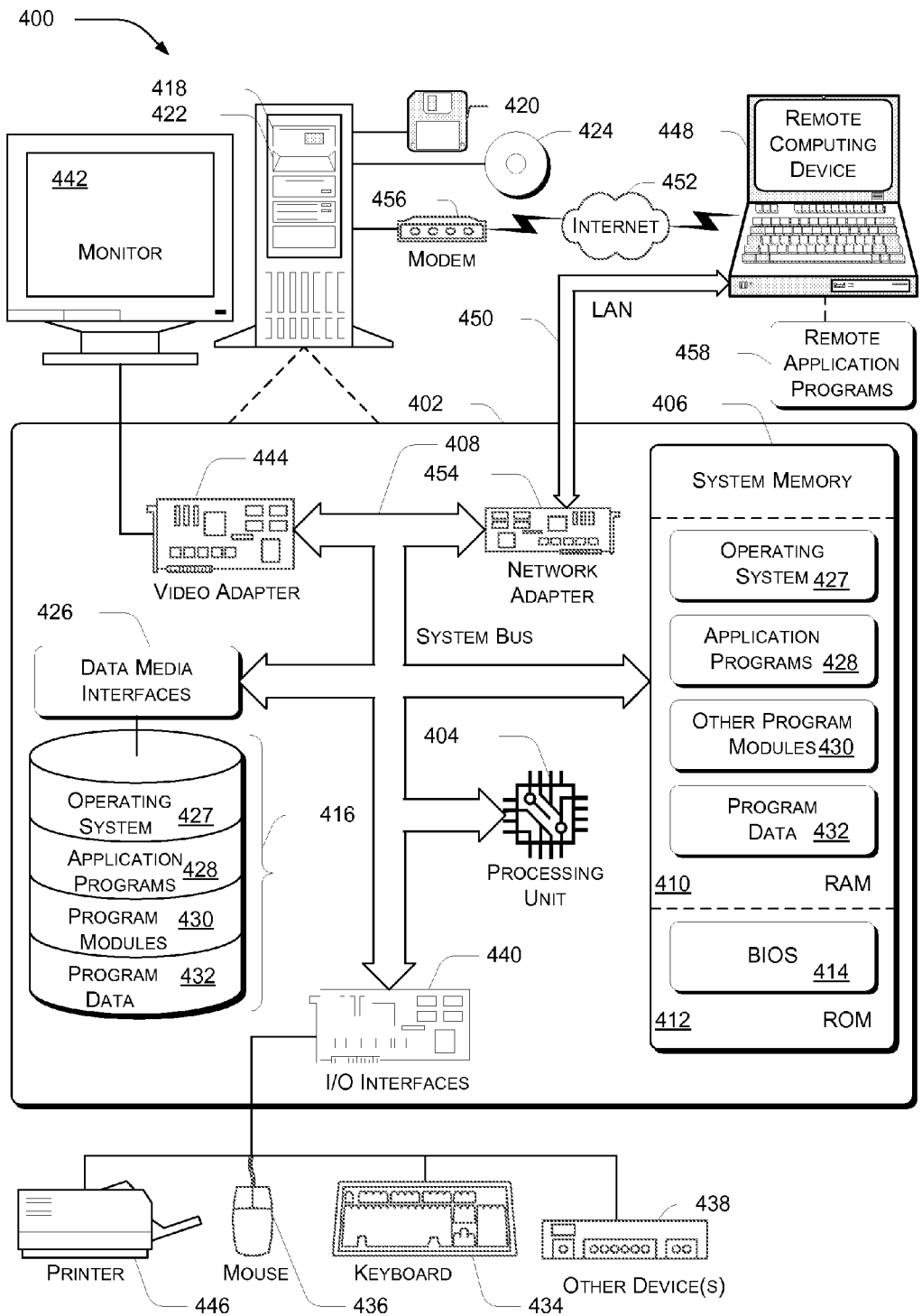
FIG. 4 illustrates a block diagram of an exemplary general computer environment.

FIG. 4 illustrates an exemplary general computer environment 400, which can be used to implement the techniques described herein, and which may be representative, in whole or in part, of elements described herein. The computer environment 400 is only one example of a computing environment and is not intended to suggest any limitation as to the scope of use or functionality of the computer and network architectures. Neither should the computer environment 400 be interpreted as having any dependency or requirement relating to any one or combination of components illustrated in the example computer environment 400.

Computer environment 400 includes a general-purpose computing-based device in the form of a computer 402. Computer 402 can be, for example, a desktop computer, a handheld computer, a notebook or laptop computer, a server computer, a game console, and so on. The components of computer 402 can include, but are not limited to, one or more processors or processing units 404, a system memory 406, and a system bus 408 that couples various system components including the processor 404 to the system memory 406.

The system bus 408 represents one or more of any of several types of bus structures, including a memory bus or memory controller, a peripheral bus, an accelerated graphics port, and a processor or local bus using any of a variety of bus architectures. By way of example, such architectures can include an Industry Standard Architecture (ISA) bus, a Micro Channel Architecture (MCA) bus, an Enhanced ISA (EISA) bus, a Video Electronics Standards Association (VESA) local bus, and a Peripheral Component Interconnects (PCI) bus also known as a Mezzanine bus.

Computer 402 typically includes a variety of computer readable media. Such media can be any available media that is accessible by computer 402 and includes both volatile and non-volatile media, removable and non-removable media.

The system memory 406 includes computer readable media in the form of volatile memory, such as random access memory (RAM) 410, and/or non-volatile memory, such as read only memory (ROM) 412. A basic input/output system (BIOS) 414, containing the basic routines that help to transfer information between elements within computer 402, such as during start-up, is stored in ROM 412 is illustrated. RAM 410 typically contains data and/or program modules that are immediately accessible to and/or presently operated on by the processing unit 404.

Computer 402 may also include other removable/non-removable, volatile/non-volatile computer storage media. By way of example, FIG. 4 illustrates a hard disk drive 416 for reading from and writing to a non-removable, non-volatile magnetic media (not shown). Furthermore, FIG. 4 illustrates a magnetic disk drive 418 for reading from and writing to a removable, non-volatile magnetic disk 420 (e.g., a "floppy disk"), additionally FIG. 4 illustrates an optical disk drive 422 for reading from and/or writing to a removable, non-volatile optical disk 424 such as a CD-ROM, DVD-ROM, or other optical media. The hard disk drive 416, magnetic disk drive 418, and optical disk drive 422 are each connected to the system bus 408 by one or more data media interfaces 426. Alternately, the hard disk drive 416, magnetic disk drive 418, and optical disk drive 422 can be connected to the system bus 408 by one or more interfaces (not shown).

The disk drives and their associated computer-readable media provide non-volatile storage of computer readable instructions, data structures, program modules, and other data for computer 402. Although the example illustrates a hard disk 416, a removable magnetic disk 420, and a removable optical disk 424, it is to be appreciated that other types of computer readable media which can store data that is accessible by a computer, such as magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like, can also be utilized to implement the exemplary computing system and environment.

Any number of program modules can be stored on the hard disk 416, magnetic disk 420, optical disk 424, ROM 412, and/or RAM 410, including by way of example, an operating system 426, one or more application programs 428, other program modules 430, and program data 432. Each of such operating system 426, one or more application programs 428, other program modules 430, and program data 432 (or some combination thereof) may implement all or part of the resident components that support the distributed file system.

A user can enter commands and information into computer 402 via input devices such as a keyboard 434 and a pointing device 436 (e.g., a "mouse"). Other input devices 438 (not shown specifically) may include a microphone, joystick, game pad, satellite dish, serial port, scanner, and/or the like. These and other input devices are connected to the processing unit 804 via input/output interfaces 440 that are coupled to the system bus 408, but may be connected by other interface and bus structures, such as a parallel port, game port, or a universal serial bus (USB).

A monitor 442 or other type of display device can also be connected to the system bus 408 via an interface, such as a video adapter 444. In addition to the monitor 442, other output peripheral devices can include components such as speakers (not shown) and a printer 446, which can be connected to computer 402 via the input/output interfaces 440.

Computer 402 can operate in a networked environment using logical connections to one or more remote computers, such as a remote computing-based device 448. By way of example, the remote computing-based device 448 can be a personal computer, portable computer, a server, a router, a network computer, a peer device or other common network node, and the like. The remote computing-based device 448 is illustrated as a portable computer that can include many or all of the elements and features described herein relative to computer 402.

Logical connections between computer 402 and the remote computer 448 are depicted as a local area network (LAN) 450 and a general wide area network (WAN) 452. Such networking environments are commonplace in offices, enterprise-wide computer networks, intranets, and the Internet.

When implemented in a LAN networking environment, the computer 402 is connected to a local network 450 via a network interface or adapter 454. When implemented in a WAN networking environment, the computer 402 typically includes a modem 456 or other means for establishing communications over the wide network 452. The modem 456, which can be internal or external to computer 402, can be connected to the system bus 408 via the input/output interfaces 440 or other appropriate mechanisms. It is to be appreciated that the illustrated network connections are exemplary and that other means of establishing communication link(s) between the computers 402 and 448 can be employed.

In a networked environment, such as that illustrated with computing environment 400, program modules depicted relative to the computer 402, or portions thereof, may be stored in a remote memory storage device. By way of example, remote application programs 458 reside on a memory device of remote computer 448. For purposes of illustration, application programs and other executable program components such as the operating system are illustrated herein as discrete blocks, although it is recognized that such programs and components reside at various times in different storage components of the computing-based device 402, and are executed by the data processor(s) of the computer.

Various modules and techniques may be described herein in the general context of computer-executable instructions, such as program modules, executed by one or more computers or other devices. Generally, program modules include routines, programs, objects, components, data structures, etc. that performs particular tasks or implement particular abstract data types. Typically, the functionality of the program modules may be combined or distributed as desired in various embodiments.

An implementation of these modules and techniques may be stored on or transmitted across some form of computer readable media. Computer readable media can be any available media that can be accessed by a computer. By way of example, and not limitation, computer readable media may comprise "computer storage media" and "communications media."

"Computer storage media" includes volatile and non-volatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

Alternately, portions of the framework may be implemented in hardware or a combination of hardware, and/or firmware. For example, one or more application specific integrated circuits (ASICs) or programmable logic devices (PLDs) could be designed or programmed to implement one or more portions of the framework.

CONCLUSION

Although embodiments for implementing streaming real-time compression have been described in language specific to structural features and/or methods, it is to be understood that the subject of the appended claims is not necessarily limited to the specific features or methods described. Rather, the specific features and methods are disclosed as exemplary implementations for providing the streaming real-time compression.

What is claimed is:

1. A method for compressing a byte code sequence comprising:
    partitioning a data stream including the byte code sequence into one or more data chunks, wherein the partitioning is based at least in part on previously occurring byte code patterns present within previously occurring data streams different from the data stream;
    associating a signature to each of the one or more data chunks;
    comparing each signature of the one or more data chunks with stored signatures to determine a match;
    listing one or more stored data chunks with potentially matching stored signatures;
    performing a forward and backward scan of byte code sequences of matched data chunks to determine a corresponding match-length, wherein a match length is a larger byte code sequence of the corresponding matched data chunk;
    generating an output that includes an element selected from the group consisting of: match-length, copy-offset tuples, and byte code sequences remaining without match-lengths; and
    passing the output for further compression, the further compression determining overlooked shorter match-lengths from the partitioning and the performing the forward and backward scan.

2. The method of claim 1, wherein the partitioning is performed on the data stream by looking at a window of data before and after a given point in the data stream to determine if data in the data stream needs to be chunked at the given point.

3. The method of claim 1, wherein the associating uses a hashing algorithm on the one or more data chunks.

4. The method of claim 1, wherein the one or more stored data chunks were communicated previous to the data stream including the byte code sequence.

5. The method of claim 1, wherein the comparing determines no match and the byte code sequence is communicated as a literal.

6. The method of claim 1, wherein the performing the forward and backward scan is performed on the matched data chunks to obtain a collection of match-lengths until a number of the determined match-lengths in the collection of match-lengths equals a threshold number of match-lengths.

7. The method of claim 6 further comprising excluding from the collection of match-lengths ones of the determined match-lengths that are completely included within another match-length of the collection of match-lengths.

8. The method of claim 7, wherein the excluding comprises a greedy algorithm.

9. The method of claim 1, wherein the further compression is based on a Lempel-Ziv scheme.

10. A computing device comprising:
a memory;
one or more processors operatively coupled to the memory;
a compression module to implement compression of a data stream communicated from the computing device, in the memory, wherein the compression module is configured to partition data in the data stream into one or more data chunks based at least in part on previously occurring byte code patterns present within previously occurring data streams different from the data stream;
a signature module to associate each of the one or more data chunks with a signature in the memory, and to compare each signature of the one or more data chunks with stored signatures to determine a match based at least in part on listing one or more stored data chunks with potentially matching stored signatures;
wherein the compression module is further configured to:
    perform a forward and backward scan of byte code sequences of matched data chunks to determine a corresponding match-length, wherein a match length is a larger byte code sequence of the corresponding matched data chunk; and
    generate an output that includes an element selected from the group consisting of: match-length, copy-offset tuples, and byte code sequences remaining without match-lengths; and
a secondary compression module to further compress shorter length matches of the one or more data chunks overlooked by the compression module.

11. The computing device of claim 10, wherein the compression module is further configured to partition the data in the data stream based on a chunker function.

12. The computing device of claim 10, wherein the compression module is further configured to scan matching candidates to ascertain similarity between the one or more data chunks and the one or more stored data chunks.

13. The computing device of claim 10, wherein the signature module evaluates the one or more data chunks using a hashing algorithm on the one or more data chunks.

14. A method of communicating data between a server and one or more client devices comprising:
    partitioning, at the server, a data stream including a byte code sequence into one or more data chunks, the partitioning based at least in part on previously occurring byte code patterns present within previously occurring data streams different from the data stream;
    associating a signature to each of the one or more data chunks;
    comparing each signature of the one or more data chunks with stored signatures to determine a match;
    listing one or more stored data chunks with potentially matching stored signatures;
    performing a forward and backward scan of byte code sequences of matched data chunks to determine a corresponding match-length, wherein a match length is a larger byte code sequence of the corresponding matched data chunk;
    generating an output comprising the match-lengths and a portion of the byte code sequence without matching stored signatures;
    passing the output for further compression, the further compression determining shorter match-lengths overlooked from the partitioning and the performing the forward and backward scan; and
    communicating the output to the one or more client devices.

15. The method of claim 14, wherein the performing the forward and backward scan is performed on the matched data chunks to obtain a collection of match-lengths until a number of the determined match-lengths in the collection of match-lengths equals a threshold number of match-lengths.

16. The method of claim 14, wherein the one or more client devices are a copy engine that emits a literal or goes to history to copy data chunks with a matching history offset or length.

17. The computing device of claim 10, wherein the compression module determines the data chunks by choosing cut points that were chosen in ones of the previously occurring data streams that have a similar byte code pattern to a byte code pattern of the data stream.

18. The computing device of claim 10, wherein the compression module is further configured to perform the forward and backward scan on the matched data chunks to obtain a collection of match-lengths until a number of the determined match-lengths in the collection of match-lengths equals a threshold number of match-lengths.

19. The computing device of claim 18, wherein the compression module is further configured to exclude from the collection of match-lengths ones of the determined match-lengths that are completely included within another match-length of the collection of match-lengths.

* * * * *